United States Patent
Shiraishi et al.

(10) Patent No.: US 7,918,934 B2
(45) Date of Patent: Apr. 5, 2011

(54) SINGLE CRYSTAL SEMICONDUCTOR MANUFACTURING APPARATUS AND MANUFACTURING METHOD, AND SINGLE CRYSTAL INGOT

(75) Inventors: Yutaka Shiraishi, Hiratsuka (JP); Jyunsuke Tomioka, Nagasaki (JP); Takuji Okumura, Nagasaki (JP); Tadayuki Hanamoto, Nagasaki (JP); Takehiro Komatsu, Nagasaki (JP); Shigeo Morimoto, Nagasaki (JP)

(73) Assignee: Sumco Techxiv Corporation, Nagasaki (JP)

( * ) Notice: Subject to any disclaimer, the term of this patent is extended or adjusted under 35 U.S.C. 154(b) by 704 days.

(21) Appl. No.: 11/605,752

(22) Filed: Nov. 29, 2006

(65) Prior Publication Data
US 2007/0068448 A1 Mar. 29, 2007

Related U.S. Application Data

(62) Division of application No. 10/487,286, filed as application No. PCT/JP02/10050 on Sep. 27, 2002, now Pat. No. 7,160,386.

(30) Foreign Application Priority Data

Sep. 28, 2001 (JP) .................................. 2001-301589

(51) Int. Cl.
*C30B 15/14* (2006.01)
(52) U.S. Cl. ................. 117/15; 117/13; 117/20; 117/21; 117/934
(58) Field of Classification Search .................... 117/13, 117/15, 20, 21, 934
See application file for complete search history.

(56) References Cited

U.S. PATENT DOCUMENTS
5,766,347 A 6/1998 Shimomura et al.
6,080,238 A 6/2000 Ito FOREIGN PATENT DOCUMENTS
EP 0108259 10/1983
EP 0 429 839 6/1991
JP 5139879 6/1993
JP 7133186 5/1995

OTHER PUBLICATIONS

EP Patent Office Communication Dated Aug. 7, 2009 for related patent application.
EP Search Report—Application No. 02 800-267.3-1215.

*Primary Examiner* — Robert M Kunemund
(74) *Attorney, Agent, or Firm* — Husch Blackwell Welsh Katz

(57) ABSTRACT

A single crystal semiconductor manufacturing apparatus in which the concentration of oxygen in a single crystal semiconductor is controlled while pulling up a single crystal semiconductor such as single crystal silicon by the CZ method, a single crystal semiconductor manufacturing method, and a single crystal ingot manufactured by the method are disclosed. The natural convection (20) in the melt (5) in a quartz crucible (3) is controlled by regulating the temperatures at a plurality of parts of the melt (5). A single crystal semiconductor (6) can have a desired diameter by regulating the amount of heat produced by heating means (9a) on the upper side. Further the ratio between the amount of heat produced by the upper-side heating means (9a) and that by the lower-side heating means (9b) is adjusted to vary the process condition. In the adjustment, the amount of heat produced by the lower-side heating means (9b) is controlled to a relatively large proportion. Without inviting high cost and large size of the manufacturing apparatus, the oxygen concentration distribution in the axial direction of the single crystal semiconductor, the diameter of the single crystal semiconductor, and the minute fluctuation of the oxygen concentration in the axial direction are controlled.

2 Claims, 8 Drawing Sheets

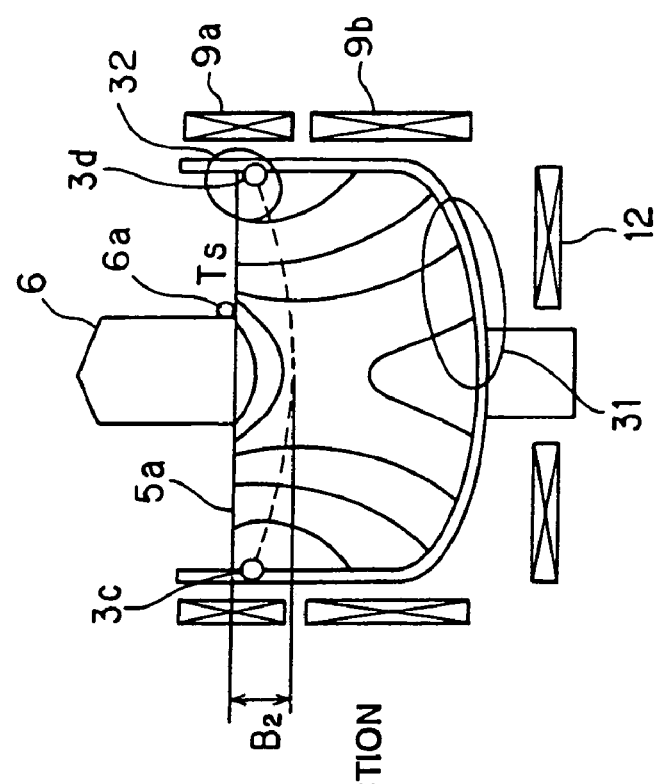
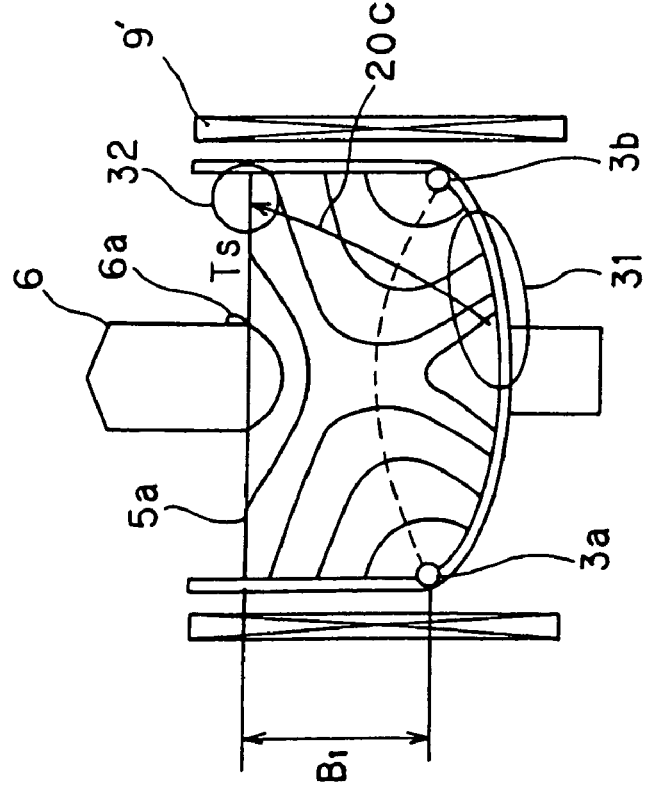
FIG 4(a)
FIG 4(b)

US 7,918,934 B2

SINGLE CRYSTAL SEMICONDUCTOR MANUFACTURING APPARATUS AND MANUFACTURING METHOD, AND SINGLE CRYSTAL INGOT

This application is a divisional of U.S. patent application Ser. No. 10/487,286, filed Feb. 20, 2004 now U.S. Pat. No. 7,160,386 filed as PCT/JP02/10050 on Sep. 27, 2002.

TECHNICAL FIELD

The present invention relates to a single crystal semiconductor manufacturing apparatus and manufacturing method which are devised so that the oxygen concentration in a single crystal semiconductor is controlled when a single crystal semiconductor, such as single crystal silicon or the like, is pulled up using the CZ (Czokralski) method or the like, and a single crystal ingot which is manufactured by this manufacturing method.

BACKGROUND ART

FIG. 1 shows one example of the construction of a single crystal pulling apparatus.

A quartz crucible 3 is disposed inside a single crystal pulling vessel 2, i. e., a CZ furnace 2. Polycrystalline silicon (Si) is heated and melted inside this quartz crucible 3. When the melting stabilizes, single crystal silicon 6 is pulled up from the silicon melt 5 inside the quartz crucible 3 by a pulling mechanism 4 using the CZ method. While this silicon is pulled up, the quartz crucible 3 is caused to rotate by a rotating shaft 10. Furthermore, the pulling mechanism 4 also rotates with respect to the pulling shaft 4a.

During the process (one batch) in which the single crystal is pulled up, various types of evaporant are generated inside the vessel 2. Accordingly, argon (Ar) gas 7 is supplied to the single crystal pulling vessel 2, and the vessel 2 is cleaned by discharging this argon gas 7 to the outside of the vessel 2 together with the evaporants, so that the evaporants are removed from the interior of the vessel 2. The supply flow rate of the argon gas 7 is set for each process within a single batch.

Furthermore, a thermal insulating plate 8 (gas distributing column) which makes the flow of the gas 7 inside the single crystal pulling vessel 2 orderly and guides the gas to the surface 5a of the melt 5, and which insulates the single crystal silicon 6 from the heat source, is disposed around the circumference of the single crystal silicon 6 above the quartz crucible 3. The distance of the gap between the lower end of the thermal insulating plate 8 and the melt surface 5a (hereafter referred to as "D0", see FIG. 1) is appropriately set.

Oxygen is present in solid solution inside the single crystal silicon 6 that is pulled up and grown. This oxygen dissolves in the silicon melt 5 from the quartz crucible 3, and is incorporated into the single crystal silicon 6 when the single crystal silicon 6 is pulled up. The oxygen concentration in the single crystal silicon 6 has a great effect on the characteristics of the resulting element or device, and also has a great effect on the yield in the manufacturing process of the element or device.

FIG. 2 shows the relationship of the amount of oxygen that is dissolved in the melt 5 from the quartz crucible 3, the amount of oxygen that evaporates from the surface 5a of the melt 5, and the amount of oxygen that is incorporated into the single crystal silicon 6. As is shown in FIG. 2, The amount of oxygen that is incorporated into the single crystal silicon 6 is an amount that is obtained by subtracting the amount of oxygen that evaporates from the melt surface 5a from the amount of oxygen that is dissolved in the melt 5 from the quartz crucible 3. Generally, approximately 99% of the oxygen that is dissolved in the melt 5 from the quartz crucible 3 evaporates; the remaining 1% (approximately) is thought to be incorporated into the single crystal silicon 6.

Accordingly, the oxygen concentration in the single crystal silicon 6 can be controlled by controlling two quantities: i.e., the amount of oxygen that is dissolved in the melt 5 from the quartz crucible 3 and the amount of oxygen that evaporates from the melt surface 5a.

Here, the amount of oxygen that is dissolved from the quartz crucible 3 is determined by parameters such as the rpm of the quartz crucible 3, the heating temperature of the quartz crucible 3 and the like.

Conventionally, therefore, inventions for controlling the oxygen concentration in the single crystal silicon to a desired concentration by adjusting parameters such as the rpm of the quartz crucible 3 and the like are publicly known techniques for which patent applications and the like have been filed (for example, official gazettes of Japanese Patent Application Laid-Open No. 10-167881 and Japanese Patent Application Laid-Open No. 10-167892).

Furthermore, the amount of oxygen that evaporates from the melt surface 5a is determined by parameters such as the flow rate of the argon gas 7, the pressure inside the furnace, D0 and the like.

Conventionally, therefore, inventions for controlling the oxygen concentration inside the single crystal silicon to a desired concentration by adjusting parameters such as D0 and the like are publicly known techniques for which patent applications and the like have been filed.

Inventions relating to the control of the "amount of dissolved oxygen" using the heating temperature of the quartz crucible 3 as a parameter include the inventions described below.

Specifically, in the official gazette of Japanese Patent No. 3000923, an invention is described in which upper and lower heaters 9a and 9b which allow independent adjustment of the heating applied to the quartz crucible 3 are installed around the circumference of the quartz crucible 3 along the vertical direction of the quartz crucible 3 as shown in FIG. 5, and the amount of dissolved oxygen is controlled by setting the ratio of the output of the upper heater 9a to the total output of both heaters 9 at a specified value, so that the oxygen concentration in the single crystal silicon 6 is kept to a target oxygen concentration or less.

Furthermore, an invention in which heaters are respectively installed around the circumference of a quartz crucible and in the bottom part of this quartz crucible, and the amount of dissolved oxygen is controlled by adjusting the outputs of these heaters so that the oxygen concentration in the single crystal silicon is controlled is described in the official gazette of Japanese patent No. 2681115.

However, the inventions described in these official gazettes are inventions that control "the amount of oxygen that is dissolved", not "the amount of oxygen that evaporates". Accordingly, the oxygen concentration range in the single crystal silicon 6 is restricted, so that this oxygen concentration cannot be freely varied over a broad range. Furthermore, there are also limits to how far the variation in the distribution of the oxygen concentration in the axial direction (direction of crystal growth) of the single crystal silicon 6 can be reduced.

Furthermore, in the case of Japanese Patent No. 3000923, no thermal insulating plate 8 is provided; accordingly, the oxygen concentration control level required in the large-diameter single crystal silicon ingots used today cannot be achieved, and in some cases, it may be impossible to pull large-diameter single crystal silicon ingots.

DISCLOSURE OF THE INVENTION

The fact that the concentration of oxygen that is incorporated into the single crystal silicon 6 is also affected by convection that is generated inside the melt 5 is known to persons skilled in the art from experience.

A technique known as the magnetic field applied crystal growth method exists as a technique for suppressing the generation of convection. This is a method in which convection in the melt 5 is suppressed by applying a magnetic field to the melt 5, so that stable crystal growth is performed.

FIG. 6 shows the oxygen concentration distribution in the axial direction of the single crystal silicon 6. The horizontal axis of FIG. 6 indicates the crystal length of the single crystal silicon 6, and the vertical axis indicates the oxygen concentration.

The oxygen concentration distribution of single crystal silicon 6 grown by the magnetic field applied crystal growth method is indicated by L1, and examples of the oxygen concentration distribution of single crystal silicon 6 grown by the general CZ method are indicated by L2 and L3. It is seen that when the magnetic field applied crystal growth method is thus used, the oxygen concentration drops as a whole as a result of the suppression of convection.

Accordingly, the control range of the oxygen concentration of single crystal silicon 6 can be set as a broad control range by controlling the intensity of the magnetic field, and the oxygen concentration distribution can be broadly adjusted within this control range.

However, a large and expensive apparatus including a superconducting magnet must be introduced in order to perform the magnetic field applied crystal growth method, so that the apparatus is expensive and bulky.

Although it is known that convection within the melt 5 has an effect on the amount of oxygen that is incorporated into the single crystal silicon 6, no technique for precisely controlling convection itself without leading to a high cost and the like has been established.

Furthermore, the abovementioned official gazettes disclose an invention in which the oxygen concentration is controlled using two heaters, i. e., upper and lower heaters. However, as was described above, this is a technique in which only the "amount of dissolved oxygen" is controlled; there is no description suggesting an additional "control of convection".

Furthermore, the inventors of present application discovered that minute fluctuations in the oxygen concentration that are generated along the axial direction of the single crystal silicon are affected by convection.

Here, according to the official gazettes described above, the "amount of dissolved oxygen" can be controlled using heaters, and in this way, the oxygen concentration distribution in the axial direction of the single crystal silicon 6 can be controlled; however, there is no disclosure relating to the control of minute fluctuations in the oxygen concentration.

Accordingly, it is a first object of the present invention to allow the precise control of convection generated in the melt, and also to broaden the control range of the oxygen concentration in the single crystal semiconductor and suppress minute fluctuations in the oxygen concentration that are generated along the axial direction of the crystal, without leading to the increased cost and increased size necessitated by the introduction of the magnetic field applied crystal growth method, by using a simple apparatus such as a heater or the like.

Furthermore, it is a second object of the present invention to allow the precise control of convection generated in the melt, and also to suppress minute fluctuations in the oxygen concentration that are generated along the axial direction of the crystal, without leading to the increased cost and increased size necessitated by the introduction of the magnetic field applied crystal growth method, by using a simple apparatus such as a heater or the like.

As is indicated in the abovementioned official gazettes, a technique in which the "amount of dissolved oxygen" is controlled using a heater, so that the oxygen concentration in the single crystal silicon 6 is controlled, has been known in the past.

Meanwhile, a technique in which the diameter of the single crystal silicon 6 is controlled using a heater is also a publicly known technique.

However, no technique which simultaneously controls the diameter of the single crystal silicon 6 while controlling the oxygen concentration in the single crystal silicon 6 using a heater has yet been established.

Accordingly, it is a third object of the present invention to broaden the control range of the oxygen concentration in the single crystal semiconductor and control the diameter of the single crystal silicon 6, without leading to the increased cost and increased size necessitated by the introduction of the magnetic field applied crystal growth method, by using a simple apparatus such as a heater or the like.

Furthermore, it is a fourth object of the present invention to broaden the control range of the oxygen concentration in the single crystal silicon 6, control the diameter of the single crystal silicon 6 and suppress minute fluctuations in the oxygen concentration that are generated along the axial direction of the single crystal semiconductor, without leading to the increased cost and increased size necessitated by the introduction of the magnetic field applied crystal growth method, by using a simple apparatus such as a heater or the like.

The inventors of the present application discovered that in cases where the oxygen concentration in the axial direction of the single crystal silicon 6 is controlled using a heater, the control range of the oxygen concentration depends on the crystal length S of the single crystal silicon 6. Specifically, the control range of the oxygen concentration is narrow in the latter stage of the pulling of the single crystal silicon 6.

Accordingly, it is a fifth object of the present invention to devise a technique so that the oxygen concentration can always be controlled to a desired concentration in a broad control range without any dependence on the crystal length S.

In order to achieve the first object, the first aspect of the invention is a single crystal semiconductor manufacturing apparatus which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this apparatus being characterized in that the apparatus comprises temperature adjustment means for controlling natural convection in the melt inside the quartz crucible by adjusting the temperatures of various portions of the melt inside the quartz crucible.

In this first aspect of the invention, as is shown in FIG. 4(*b*), the temperatures of various portions of the melt 5 inside the quartz crucible 3 are adjusted, so that the generation of natural convection 20 in the melt 5 is controlled. As a result of such convection being controlled, the control range of the oxygen concentration in the single crystal silicon 6 can be broadened, so that the oxygen concentration distribution in the axial direction of the single crystal silicon 6 can be broadly adjusted within this broad control range.

Furthermore, FIG. 9(b) shows the results that were obtained in a case where the temperatures of various portions of the melt 5 inside the quartz crucible 3 were adjusted so that the generation of natural convection 20 in the melt 5 was promoted. As is shown in FIG. 9(b), minute fluctuations in the oxygen concentration that occur along the axial direction of the single crystal silicon 6 are suppressed by promoting the generation of convection.

Thus, in the first aspect of the invention, since convection 20 generated in the melt 5 can be controlled with good precision by using temperature control means such as a heater 9 or the like which is small and inexpensive compared to the introduction of the magnetic field applied crystal growth method, the oxygen concentration distribution in the axial direction of the single crystal silicon 6 can be broadly adjusted within a broad control range, and minute fluctuations in the oxygen concentration that are generated along the axial direction within the crystal can be suppressed, without leading to the increased cost and increased size necessitated by the introduction of the magnetic field applied crystal growth method.

The second aspect of the invention is according to the first aspect of the invention, and is characterized in that the generation of natural convection is suppressed by adjusting the temperature so that the temperature of the bottom surface of the quartz crucible is lower than the temperature of the upper portions of the side walls of the quartz crucible.

In this second aspect of the invention, as is shown (for example) in FIG. 4(b), the ratio of the amount of heating (output) generated by the upper heater 9a to the amount of heating (output) generated by the lower heater 9b is adjusted so that the temperature of the bottom surface part 31 of the quartz crucible 3 is lower than the temperature of the upper portions 32 of the side walls of the quartz crucible 3. As a result of the temperature of the bottom surface part 31 of the quartz crucible 3 being lower than the temperature of the upper portions 32 of the side walls of the quartz crucible 3, the generation of natural convection 20 as rising currents that are oriented toward the upper portions of the side walls of the crucible 3 from the bottom surface of the crucible 3 is suppressed.

The third aspect of the invention is according the first aspect of the invention, and the fourth aspect of the invention is according to the second aspect of the invention, and these inventions are respectively characterized in that a member which causes the gas inside the single crystal pulling vessel to flow orderly and guides this gas to the surface of the melt, and which insulates the single crystal semiconductor from the heat source, is disposed around the circumference of the single crystal semiconductor above the quartz crucible.

As a result of the provision of a thermal insulating plate 8 (gas distributing column) as shown in FIG. 1, the evaporation of oxygen from the melt 5 can be stabilized, so that the precision of the control of the oxygen concentration in the axial direction of the single crystal silicon 6 can be improved.

The fifth aspect of the invention is according to the first aspect of the invention, the sixth aspect of the invention is according to the second aspect of the invention, the seventh aspect of the invention is according to the third aspect of the invention, and the eighth aspect of the invention is according to the fourth aspect of the invention, and these inventions are respectively characterized in that a plurality of heating means that allow the independent adjustment of the amount of heating that is applied to the quartz crucible are disposed around the circumference of the quartz crucible along the vertical direction of the quartz crucible.

In the fifth through eighth aspect of the invention, as is shown in FIG. 4(b), the temperature of the bottom surface part 31 of the quartz crucible 3 can be set at a temperature that is lower than the temperature of the upper portions 32 of the side walls of the quartz crucible 3 by independently adjusting the amount of heating (output) of the upper heater 9a and the amount of heating (output) of the lower heater 9b, so that the generation of natural convection 20 as rising currents that are oriented toward the upper portions of the side walls of the crucible 3 from the bottom surface of the crucible 3 is suppressed.

In order to achieve the third object, the ninth aspect of the invention is a single crystal semiconductor manufacturing apparatus which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this apparatus being characterized in that a plurality of heating means that allow the independent adjustment of the amount of heating that is applied to the quartz crucible are disposed around the circumference of the quartz crucible along the vertical direction of the quartz crucible, the diameter of the single crystal semiconductor is controlled to a desired size by adjusting the amount of heating of the upper-side heating means, and the oxygen concentration in the single crystal semiconductor is controlled to a desired concentration by adjusting the amount of heating of the lower-side heating means.

In the ninth aspect of the invention, the diameter of the single crystal silicon 6 can be simultaneously controlled while controlling the oxygen concentration in the axial direction of the single crystal silicon 6 using heaters 9a and 9b that are compact and low-cost compared to the introduction of the magnetic field applied crystal growth method.

In order to achieve the abovementioned first object, the tenth aspect of the invention is a single crystal semiconductor manufacturing apparatus which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this apparatus being characterized in that a plurality of heating means that allow the independent adjustment of the amount of heating that is applied to the quartz crucible are disposed around the circumference of the quartz crucible along the vertical direction of the quartz crucible, the oxygen concentration in the single crystal semiconductor is controlled to a desired concentration by adjusting the amount of heating of the lower-side heating means, and natural convection in the melt is controlled so that fluctuations in the oxygen concentration in the axial direction are suppressed by adjusting the ratio of the amount of heating of the upper-side heating means to the amount of heating of the lower-side heating means.

In the tenth aspect of the invention, minute fluctuations in the oxygen concentration that are generated in the axial direction of the single crystal silicon 6 can be suppressed, and at the same time the oxygen concentration in the axial direction of the single crystal silicon 6 can also be controlled, by controlling natural convection using heaters 9a and 9b that are compact and low-cost compared to the introduction of the magnetic field applied crystal growth method.

In order to achieve the abovementioned fourth object, the eleventh aspect of the invention is a single crystal semiconductor manufacturing apparatus which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this apparatus being characterized in that a plurality of heating means that allow the independent adjustment of the amount of heating that is applied to the quartz crucible are disposed around the circumference of the quartz crucible along the vertical direction of the quartz crucible, the diameter of the single crystal semiconductor is controlled to a desired size by adjusting the amount of heating of the upper-side heating means, the oxygen concentration in the single crystal semiconductor is controlled to a desired concentration by adjusting the amount of heating of the lower-side heating means, and natural convection in the melt is controlled so that minute fluctuations in the oxygen concentration in the axial direction of the single crystal semiconductor are suppressed by adjusting the ratio of the amount of heating of the upper-side heating means to the amount of heating of the lower-side heating means.

In the eleventh aspect of the invention, natural convection can be controlled so that minute fluctuations in the oxygen concentration that are generated in the axial direction in the single crystal silicon 6 can be suppressed, and at the same time the diameter of the single crystal silicon 6 can be controlled while controlling the oxygen concentration in the axial direction of the single crystal silicon 6, using heaters 9a and 9b that are compact and low-cost compared to the introduction of the magnetic field applied crystal growth method.

The twelfth aspect of the invention is according to the ninth aspect of the invention, the thirteenth aspect of the invention is according to the tenth aspect of the invention, and the fourteenth aspect of the invention is according to the eleventh aspect of the invention, and these inventions are respectively characterized in that a member which causes the gas inside the single crystal pulling vessel to flow orderly so that this gas is guided to the surface of the melt, and which insulates the single crystal semiconductor from the heat source, is disposed around the circumference of the single crystal semiconductor above the quartz crucible.

In the twelfth through fourteenth aspect of the invention, the evaporation of oxygen from the melt 5 can be stabilized by installing the thermal insulating plate 8 (gas distributing column) shown in FIG. 1, so that the precision of the control of the oxygen concentration in the axial direction of the single crystal silicon 6 obtained in the fifth, sixth and seventh aspect of the inventions can be further heightened.

In order to achieve the first object, the fifteenth aspect of the invention is a single crystal semiconductor manufacturing method which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this method being characterized in that natural convection in the melt inside the quartz crucible is controlled by adjusting the temperatures of various portions of the melt inside the quartz crucible.

The fifteenth aspect of the invention is an invention in which an invention of a manufacturing method is substituted for the invention of a manufacturing apparatus in the first aspect of the invention.

In order to achieve the third object, the sixteenth aspect of the invention is a single crystal semiconductor manufacturing method which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this method being characterized in that the diameter of the single crystal semiconductor is controlled to a desired size by adjusting the amount of heating applied to the upper side of the quartz crucible, and the oxygen concentration in the single crystal semiconductor is controlled to a desired concentration by adjusting the amount of heating applied to the lower side of the quartz crucible.

The sixteenth aspect of the invention is an invention in which an invention of a manufacturing method is substituted for the invention of a manufacturing apparatus in the ninth aspect of the invention.

In order to achieve the abovementioned fifth object, the seventeenth aspect of the invention is a single crystal semiconductor manufacturing apparatus which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this apparatus being characterized in that a plurality of heating means that allow the independent adjustment of the amount of heating that is applied to the quartz crucible are disposed around the circumference of the quartz crucible along the vertical direction of the quartz crucible, and the distribution of the oxygen concentration in the axial direction of the single crystal semiconductor is controlled to a desired distribution by adjusting the ratio of the amount of heating of the upper-side heating means to the amount of heating of the lower-side heating means, and varying the process conditions.

Cr1 shown in FIG. 8 indicates the control range of the oxygen concentration of the single crystal silicon 6 that can be caused to fluctuate merely by adjusting the output ration (power ratio) of the heaters 9a and 9b; this control range depends on the crystal length S of the single crystal silicon 6. Specifically, the control range of the oxygen concentration becomes narrower in the latter stage of the pulling of the single crystal silicon 6.

Accordingly, the output ratio of the heaters 9a and 9b is adjusted to an output ratio which is such that the output of the lower heater 9b is relatively large, and the process conditions are varied; e. g., the rpm of the quartz crucible 3 is increased or the like. As a result, the upper limit of the control range changes from L6 to L7, so that at least the oxygen concentration in the latter stage of the pulling of the single crystal silicon 6 shifts to the high oxygen side. Alternatively, the abovementioned output ratio is adjusted to an output ratio which is such that the output of the lower heater 9b is relatively small, and the process conditions are varied; e. g., the pressure inside the CZ furnace 2 is increased or the like. As a result, the lower limit of the control range changes from L8 to L9, so that at least the oxygen concentration in the latter stage of the pulling of the single crystal silicon 6 shifts to the low oxygen side.

Thus, the control range of the oxygen concentration in the latter stage of the pulling of the single crystal silicon 6 is broadened. Accordingly, this oxygen concentration control range in the latter stage of pulling has a breadth that is comparable to that of the control range in the former stage of pulling, so that the oxygen concentration can always be controlled to a desired concentration in a broad control range without any dependence on the crystal length S. Specifically, the oxygen concentration in the axial direction of the single crystal silicon 6 can be controlled to a fixed upper-limit value of the target range Ar0, and can be controlled to a fixed lower-limit value of the target range Ar0. Furthermore, this oxygen concentration can also be controlled to a fixed arbitrary value within the target range Ar0. Moreover, the profile of the oxygen concentration can be set at an arbitrary profile within the target range Ar0.

The eighteenth aspect of the invention is according to the seventeenth aspect of the invention, and is characterized in that at least the oxygen concentration in the latter stage of the pulling of the single crystal semiconductor is caused to shift to the high oxygen side by adjusting the ratio of the amount of heating of the upper-side heating means to the amount of heating of the lower-side heating means to an ratio which is such that the amount of heating of the lower-side heating means is relatively large, and increasing the amount of oxygen that is dissolved in the melt from the quartz crucible.

In the eighteenth aspect of the invention, the lower limit of the control range is changed from L6 to L7, so that at least the oxygen concentration in the latter stage of the pulling of the single crystal silicon 6 is shifted to the high oxygen side, by adjusting the output ratio to an output ratio which is such that the output of the lower heater 9b is relatively large, and increasing the amount of oxygen dissolved in the quartz crucible 3 by increasing the rpm of the quartz crucible 3 or the like.

The nineteenth aspect of the invention is according to the seventeenth aspect of the invention, and is characterized in that at least the oxygen concentration in the latter stage of the pulling of the single crystal semiconductor is caused to shift to the high oxygen side by adjusting the ratio of the amount of heating of the upper-side heating means to the amount of heating of the lower-side heating means to an ratio which is such that the amount of heating of the lower-side heating means is relatively large, and increasing the rpm of the quartz crucible.

In the nineteenth aspect of the invention, the upper limit of the control range is changed from L6 to L7, so that at least the oxygen concentration in the latter stage of the pulling of the single crystal silicon 6 is caused to shift to the high oxygen side, by adjusting the output ratio to an output ratio which is such that the output of the lower heater 9b is relatively large, and increasing the rpm of the quartz crucible 3.

The twentieth aspect of the invention is according to the seventeenth aspect of the invention, and is characterized in that at least the oxygen concentration in the latter stage of the pulling of the single crystal semiconductor is caused to shift to the low oxygen side by adjusting the ratio of the amount of heating of the upper-side heating means to the amount of heating of the lower-side heating means to a ratio which is such that the amount of heating of the lower-side heating means is relatively small, and reducing the amount of oxygen that evaporates from the surface of the melt.

In the twentieth aspect of the invention, the lower limit of the control range is changed from L8 to L9 by adjusting the output ratio to an output ratio which is such that the output of the lower heater 9b is relatively small, and reducing the amount of oxygen that evaporates form the surface 5a of the melt by increasing the pressure inside the CZ furnace 2 or the like, so that at least the oxygen concentration in the latter stage of the pulling of the single crystal silicon 6 is caused to shift to the low oxygen side.

The twenty-first aspect of the invention is according to the seventeenth aspect of the invention, and is characterized in that at least the oxygen concentration in the latter stage of the pulling of the single crystal semiconductor is caused to shift to the low oxygen side by adjusting the ratio of the amount of heating of the upper-side heating means to the amount of heating of the lower-side heating means to a ratio which is such that the amount of heating of the lower-side heating means is relatively small, and increasing the pressure inside the single crystal pulling vessel.

In the twenty-first aspect of the invention, the lower limit of the control range is changed from L8 to L9 by adjusting the output ratio to an output ratio which is such that the output of the lower heater 9b is relatively small, and increasing the pressure inside the CZ furnace 2, so that at least the oxygen concentration in the latter stage of the pulling of the single crystal silicon 6 is caused to shift to the low oxygen side.

In order to achieve the second object, the twenty-second aspect of the invention is a single crystal semiconductor manufacturing apparatus which is devised so that a quartz crucible is accommodated inside a single crystal pulling vessel, a polycrystalline raw material is melted inside this quartz crucible, a single crystal semiconductor is pulled up from the melt inside this quartz crucible, and the oxygen concentration in the single crystal semiconductor is controlled during this pulling, this apparatus being characterized in that a plurality of heating means that allow the independent adjustment of the amount of heating that is applied to the quartz crucible are disposed around the circumference of the quartz crucible along the vertical direction of the quartz crucible, and a control action is performed so that fluctuations in the oxygen concentration in the axial direction of the single crystal semiconductor are suppressed by adjusting the ratio of the amount of heating of the upper-side heating means to the amount of heating of the lower-side heating means to a ratio which is such that the amount of heating of the lower-side heating means is relatively large.

In the twenty-second aspect of the invention, as is shown in FIG. 9(b), minute fluctuations in the oxygen concentration in the axial direction of the single crystal silicon 6 can be suppressed by setting the output ratio at an output ratio which is such that the output of the lower heater 9b is relatively large.

Thus, minute fluctuations in the oxygen concentration that are generated along the axial direction of the crystal 6 can be suppressed using heaters 9 which are compact and low-cost compared to the introduction of the magnetic field applied crystal growth method.

The twenty-third aspect of the invention is a single crystal ingot manufactured by being pulled up from a melt in a quartz crucible, which is characterized in that this ingot is manufactured by being pulled up while natural convection in the melt is controlled by adjusting the temperatures of various portions of the melt inside the quartz crucible.

The twenty-third aspect of the invention is the single crystal ingot manufactured by the manufacturing method of the fifteenth aspect of the invention. The twenty-fourth aspect of the invention is a single crystal ingot which is manufactured by being pulled up from a melt inside a quartz crucible, this ingot being characterized in that this ingot is a single crystal ingot whose diameter is controlled to a desired diameter by adjusting the amount of heating that is applied to the upper side of the quartz crucible, and whose oxygen concentration is controlled to a desired concentration by adjusting the amount of heating that is applied to the lower side of the quartz crucible. The twenty-fourth aspect of the invention is the single crystal ingot manufactured by the manufacturing method of the sixteenth aspect of the invention.

BRIEF DESCRIPTION OF THE DRAWINGS

FIGS. 4(a) and 4(b) are diagrams which show a comparison of the temperature distribution in various portions of the melt;

BEST MODE FOR CARRYING OUT THE INVENTION

The apparatus of the embodiment will be described below with reference to the attached figures.

Figure 1:
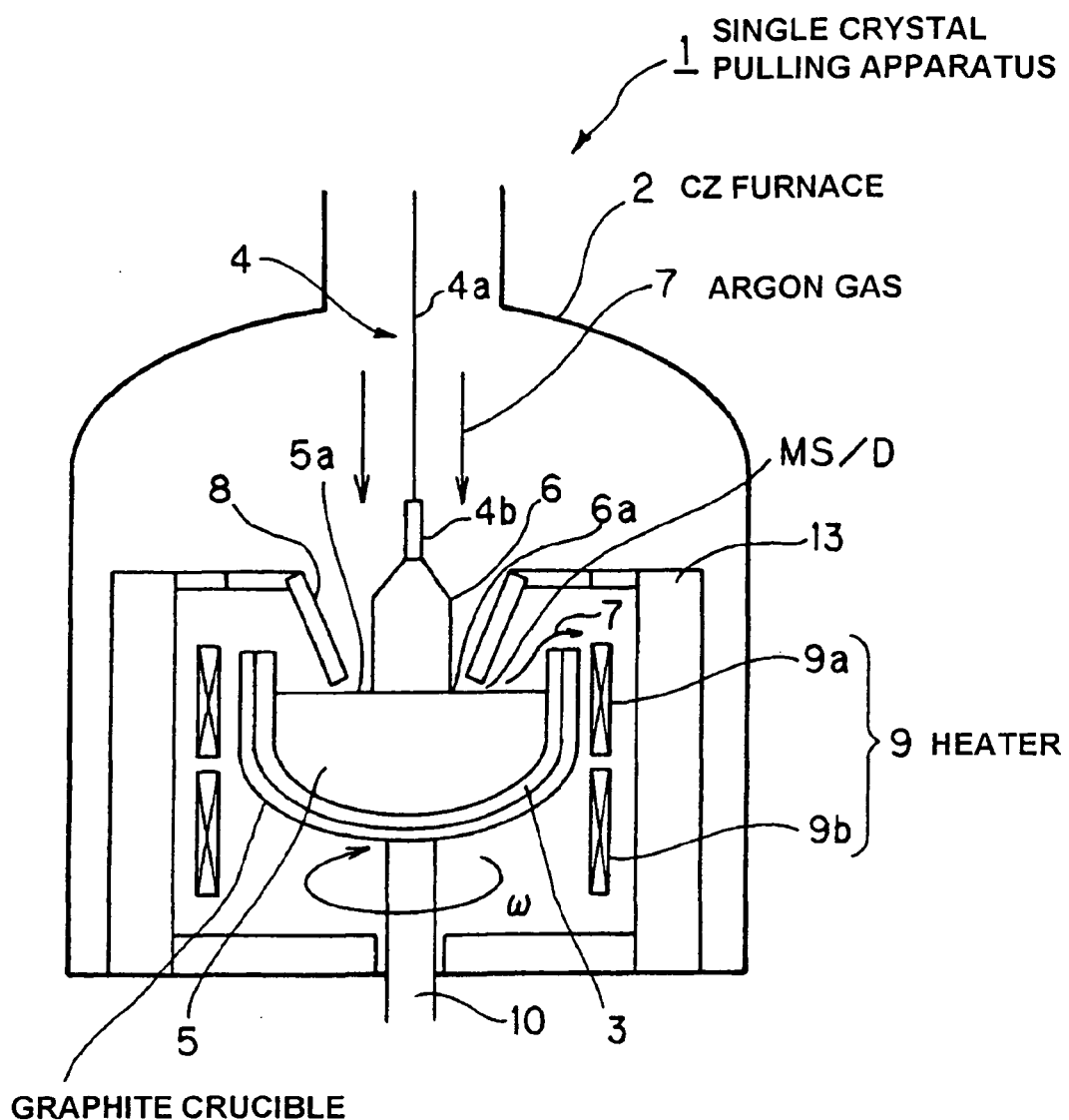
FIG. 1 is a diagram which shows the apparatus of the embodiment.

FIG. 1 is a diagram which shows the construction of the embodiment from the side.

As is shown in FIG. 1, the single crystal pulling apparatus 1 of the embodiment comprises a CZ furnace (chamber) 2 as a single crystal pulling vessel.

A quartz crucible 3 in which a polycrystalline silicon raw material is melted and accommodated as a melt 5 is disposed inside the CZ furnace 2. The outside of the quartz crucible 3 is covered by a graphite crucible. Heaters 9 which heat and melt the polycrystalline silicon raw material inside the quartz crucible 3 are disposed around the circumference of the quartz crucible 3.

The heaters 9 are divided into two stages, i.e., upper and lower heaters 9a and 9b, which are disposed around the circumference of the quartz crucible 3 along the vertical direction of the quartz crucible 3. In the heaters 9a and 9b, the amount of heating that is applied to the quartz crucible 3, i.e., the output, can be independently adjusted. In the apparatus 1 of the embodiment, the heaters 9 are divided into two stages; however, these heaters 9 may also be divided into three or more stages.

A heat-retaining tube 13 is disposed between the heaters 9 and the CZ furnace 2.

A pulling mechanism 4 is disposed above the quartz crucible 3. The pulling mechanism 4 comprises a pulling shaft 4a and a seed crystal 4b.

When the melt inside the quartz crucible 3 stabilizes, the pulling shaft 4a moves in the vertical direction, so that the seed crystal 4a is immersed in the melt 5, and a single crystal silicon ingot 6 is pulled up from the melt 5 by the CZ method. During this pulling, the quartz crucible 3 is caused to rotate by a rotating shaft 10. Furthermore, the rotating shaft 10 can be driven in the vertical direction, so that the quartz crucible 3 can be raised and lowered, and positioned in an arbitrary position.

A vacuum (approximately 10 to 50 Torr) is maintained inside the CZ furnace 2 by shutting out the interior of the CZ furnace 2 from the atmosphere. Specifically, argon gas 7 is supplied to the CZ furnace 2 as an inert gas, and this is exhausted from the exhaust port of the CZ furnace 2 by means of a pump. As a result, the pressure inside the furnace 2 is reduced to a low pressure.

During the single crystal pulling process (one batch), various evaporants are generated inside the CZ furnace 2. Accordingly, argon gas 7 is supplied to the CZ furnace 2, and this is exhausted to the outside of the CZ furnace 2 along with the evaporants so that the evaporants are removed from the interior of the CZ furnace 2, thus cleaning the furnace. The supply flow rate of the argon gas 7 is set for each process in one batch.

The silicon melt 5 decreases as the single crystal silicon 6 is pulled up. As the silicon melt 5 decreases, the contact area between the melt 5 and the quartz crucible 3 varies, so that the amount of oxygen dissolved from the quartz crucible 3 varies. This variation has an effect on the oxygen concentration distribution in the single crystal silicon 6. Accordingly, in order to prevent this, the polycrystalline silicon raw material may be supplied in a supplementary manner to the interior of the quartz crucible 3 in which the melt 5 has decreased.

A thermal insulating plate 8 (gas distributing column) which is formed substantially in the shape of an inverted truncated cone is disposed around the circumference of the single crystal silicon 6 above the quartz crucible 3. The thermal insulating plate 8 is supported on the heat-retaining tube 13. The thermal insulating plate 8 guides the argon gas 7 which is supplied to the interior of the CZ furnace 2 from above as a carrier gas to the center of the surface 5a of the melt, and further causes this gas to pass over the surface 5a of the melt so that this gas is guided to the circumferential edge portions of the melt surface 5a. Then, the argon gas 7 is exhausted from the exhaust port disposed in the lower part of the CZ furnace 2 together with the gas that evaporates from the melt 5. Accordingly, the oxygen that is evaporated from the melt 5 is stably maintained so that the gas flow velocity on the liquid surface can be stabilized.

Furthermore, the thermal insulating plate 8 thermally insulates the single crystal silicon 6 from the radiant heat generated by heat sources such as the crucible 3, melt 5, heaters 9 and the like. Moreover, the thermal insulating plate 8 prevents impurities (e.g., silicon oxides) and the like generated inside the furnace from adhering to the single crystal silicon 6 and impairing the growth of the single crystal. The distance D0 of the gap between the lower end of the thermal insulating plate 8 and the surface 5a of the melt can be adjusted by raising and lowering the rotating shaft 10 so that the position of the crucible 3 in the vertical direction is varied.

Oxygen is dissolved in solid solution in the single crystal silicon 6 that is pulled up and grown. This oxygen is dissolved in the silicon melt 5 from the quartz crucible 3, and is incorporated into the single crystal silicon 6 when the single crystal silicon 6 is pulled up. The oxygen concentration in the single crystal silicon 6 has a great effect on the characteristics of the element or device, and also has a great effect on the yield in the manufacturing process of the element or device.

Figure 2:
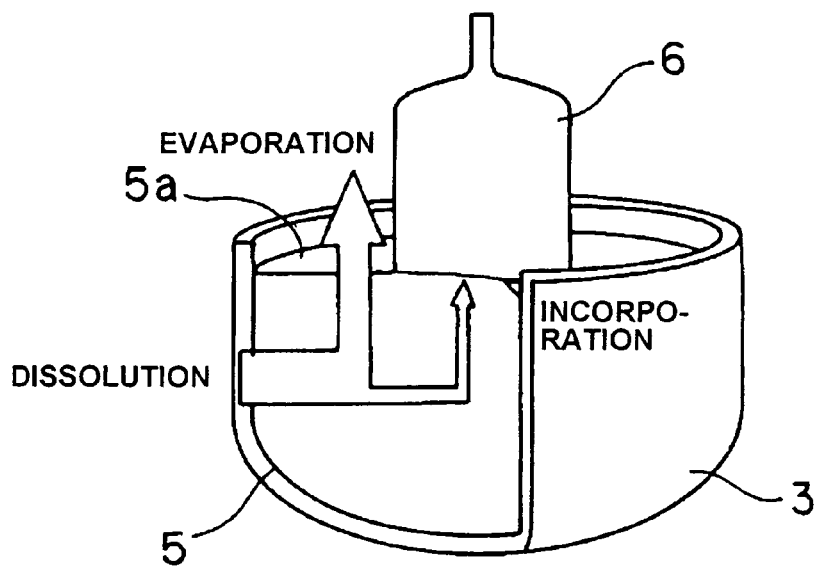
FIG. 2 is a diagram which illustrates the process whereby oxygen is incorporated into the single crystal silicon.
Figure 3:
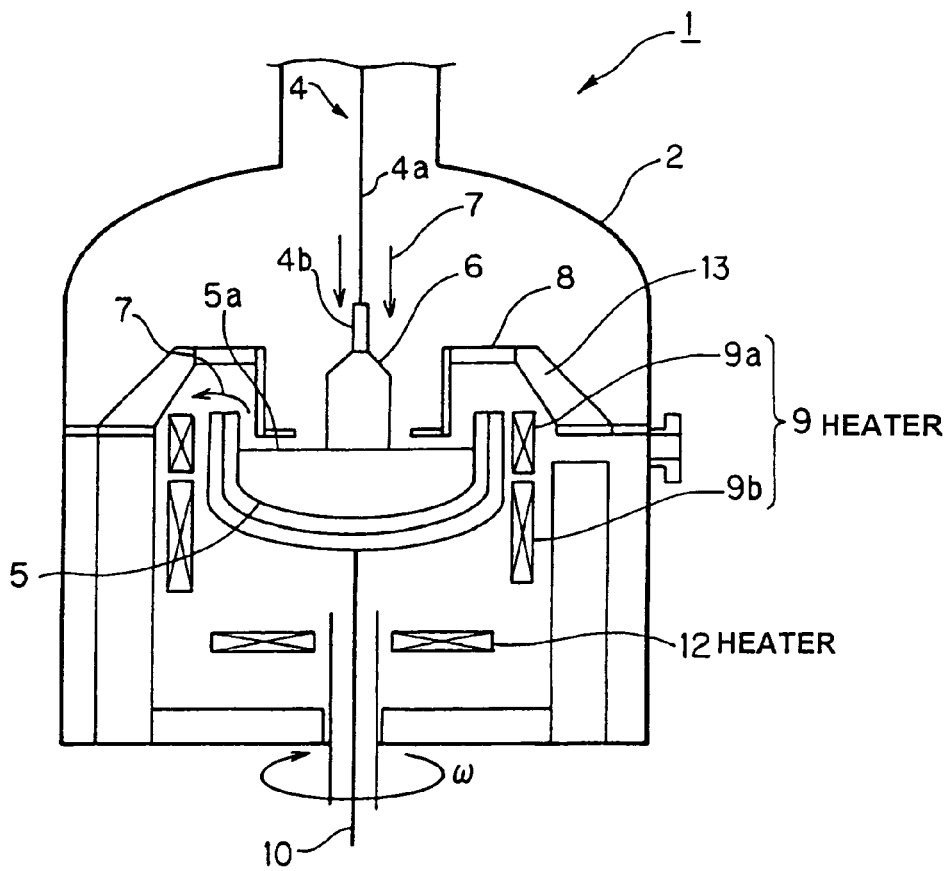
FIG. 3 is a diagram which shows another example of the construction of the heaters.
Figure 5:
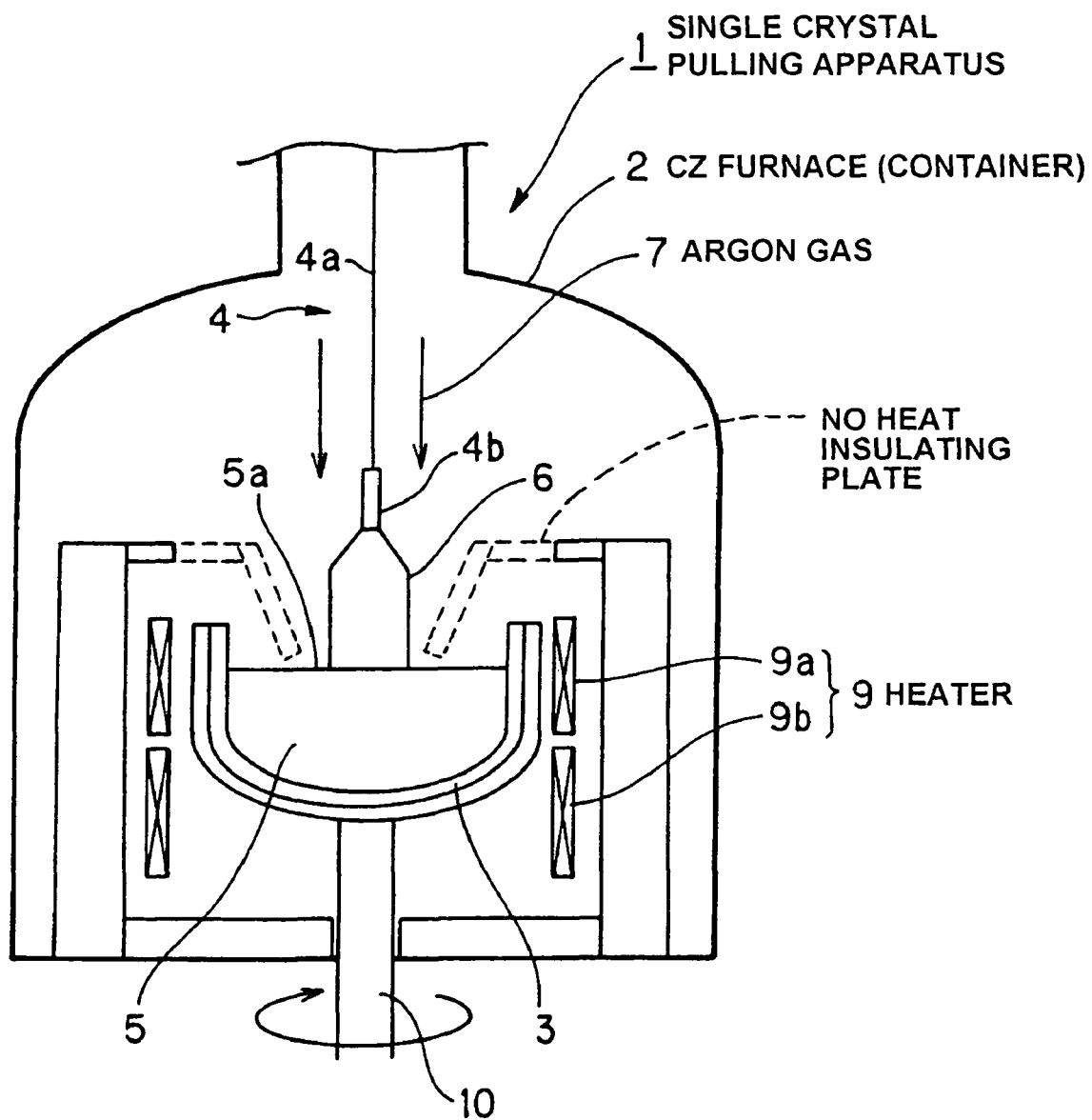
FIG. 5 is a diagram which shows the prior art.

FIG. 2 shows the relationship of the amount of oxygen that is dissolved in the melt 5 from the quartz crucible 3, the amount of oxygen that evaporates from the surface 5a of the melt 5, and the amount of oxygen that is incorporated into the single crystal silicon 6. As is shown in FIG. 2, the amount of oxygen that is incorporated into the single crystal silicon 6 (hereafter referred to as the "amount of incorporated oxygen") is obtained by subtracting the amount of oxygen that evaporates from the surface 5a of the melt (hereafter referred to as the "amount of evaporated oxygen") from the amount of oxygen that is dissolved in the melt 5 from the quartz crucible 3 (hereafter referred to as the "amount of dissolved oxygen").

Generally, it may be viewed that approximately 99% of the oxygen that is dissolved in the melt 5 from the quartz crucible 3 evaporates, and that the remaining (approximate) 1% is incorporated into the single crystal silicon 6.

Accordingly, the oxygen concentration in the single crystal silicon 6 can be controlled by controlling two amounts, i. e., the amount of oxygen that is dissolved in the melt 5 from the quartz crucible 3 and the amount of oxygen that evaporates from the surface 5a of the melt.

Here, the "amount of dissolved oxygen" is determined by parameters such as the rpm ω of the quartz crucible 3, the heating temperature of the quartz crucible 3 and the like.

Furthermore, the "amount of evaporated oxygen" is determined by parameters such as the flow rate of the argon gas 7, the pressure inside the CZ furnace 2, D0 and the like.

The operation of the abovementioned apparatus 1 of the embodiment will be described below.

Reference Example

Figure 6:
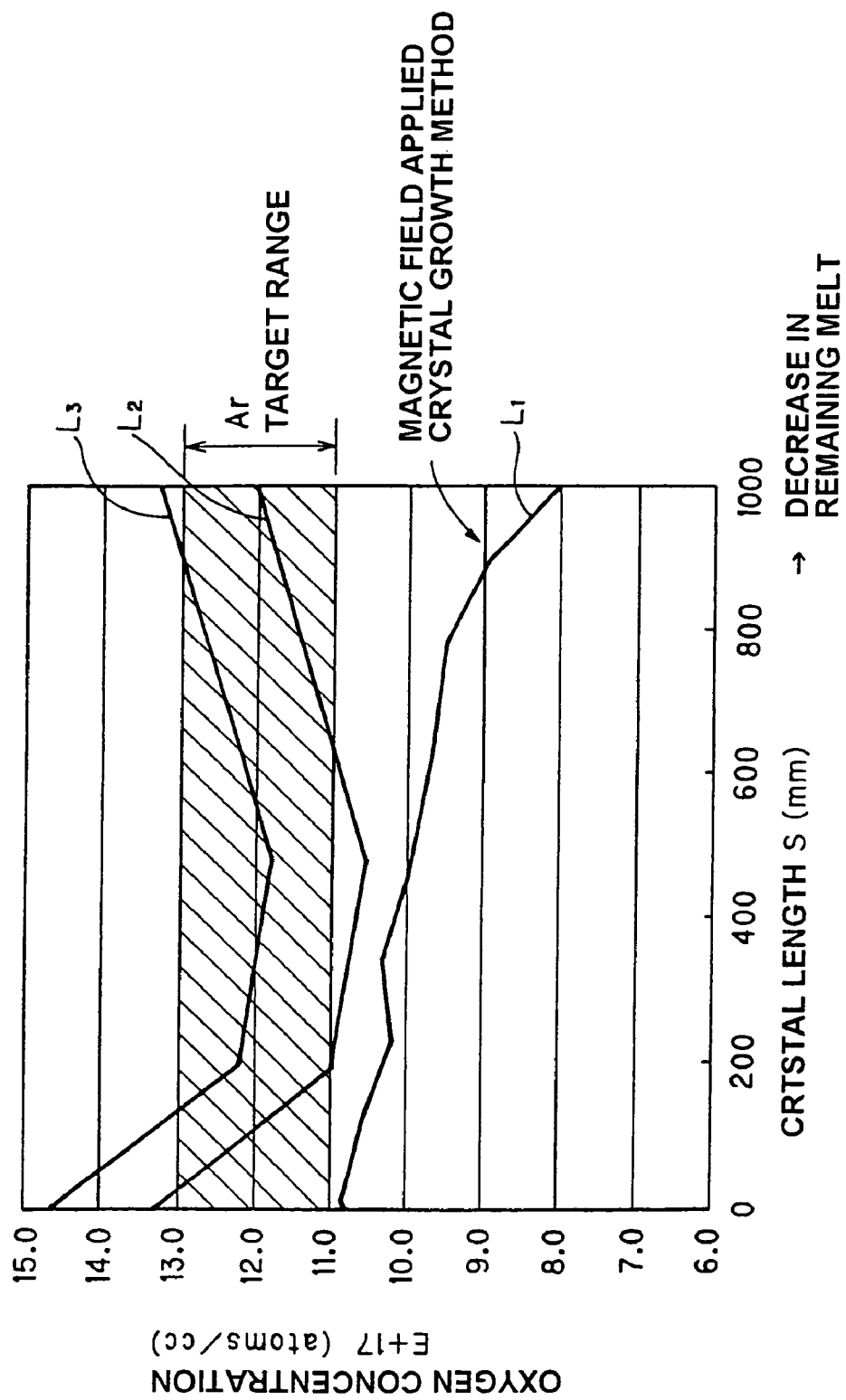
FIG. 6 is a graph which illustrates the oxygen concentration distribution in the direction of the axis of length of the single crystal silicon.

FIG. 6 shows the oxygen concentration distribution in the direction of the axis of length of the single crystal silicon 6. The horizontal axis in FIG. 6 indicates the crystal length S of the single crystal silicon 6 (which is substantially inversely proportional to the remaining molten amount of the melt 5), and the vertical axis indicates the oxygen concentration. Here, the crystal length S of the single crystal silicon 6 is substantially inversely proportional to the remaining molten amount of the melt 5.

The oxygen concentration in the silicon melt 5 is high at the time that single crystal pulling is initiated. Subsequently, as the single crystal is pulled, the contact area between the quartz crucible 3 and the melt 5 decreases, so that the oxygen concentration in the melt 5 decreases. Accordingly, as is indicated by L1 in FIG. 6, the oxygen concentration in the single crystal silicon 6 obtained after growth tends to show a high value in the initial stage of pulling, and this oxygen concentration tends to drop as the pulling enters the latter stage.

Accordingly, in this reference example, control is exercised so that the oxygen concentration distribution in the axial direction of the single crystal silicon 6 is uniform along the direction of the axis of length, by using a combination of 1) control of the amount of dissolved oxygen, and 2) control of the amount of evaporated oxygen, described below.

1) Control of the Amount of Dissolved Oxygen

A function in which the crystal length S of the single crystal silicon 6, i. e., the remaining molten amount of the melt 5, is taken as a variable, and the rpm ω of the crucible is taken as a function value, is prepared beforehand. This function is set so that the oxygen concentration distribution in the axial direction of the single crystal silicon 6 is maintained at a target concentration distribution. Accordingly, the remaining molten amount of the melt 5 is measured, and the crucible rpm ω that corresponds to this measured remaining molten amount is determined from the abovementioned function. Then, the rotating shaft 10 is rotated so that this crucible rpm ω is obtained. Thus, the oxygen concentration distribution in the axial direction of the single crystal silicon 6 is controlled to a desired concentration distribution by adjusting the rpm ω of the quartz crucible 3 in accordance with the remaining molten amount of the melt 5, i. e., the crystal length S of the single crystal silicon 6.

2) Control of Amount of Evaporated Oxygen

A function in which the crystal length S of the single crystal silicon 6, i. e., the remaining molten amount of the melt 5, is taken as a variable, and D0 is taken as a function value, is prepared beforehand. This function is set so that the oxygen concentration distribution in the axial direction of the single crystal silicon 6 is maintained at a target concentration distribution. Accordingly, the remaining molten amount of the melt 5 is measured, and the D0 value that corresponds to this measured remaining molten amount is determined from the abovementioned function. Then, the rotating shaft 10 is moved in the vertical direction so that this D0 value is obtained. Thus, the oxygen concentration distribution in the axial direction of the single crystal silicon 6 is controlled to a desired concentration distribution by adjusting D0 in accordance with the remaining molten amount of the melt 5, i. e., the crystal length S of the single crystal silicon 6. Furthermore, it would also be possible to control the oxygen concentration distribution in the axial direction of the single crystal silicon 6 by adjusting D0 to a fixed value regardless of the remaining molten amount of the melt 5, i. e., the magnitude of the crystal length S of the single crystal silicon 6. The same is true of the flow rate of the argon gas 7, and the pressure inside the CZ furnace 2.

As a result of exercising control that combined the abovementioned 1) control of the amount of dissolved oxygen and 2) control of the amount of evaporated oxygen, the oxygen concentration distribution in the axial direction of the single crystal silicon 6 was the distribution indicated by L2 or L3 in FIG. 6. The oxygen concentration distribution L2 indicates a case in which the target oxygen concentration was set at a high value, and the oxygen concentration distribution L3 indicates a case in which the target oxygen concentration was set at a low value.

In FIG. 6, the target range Ar indicates one example of a target range for the oxygen concentration distribution in the single crystal silicon 6 required in recent years.

The oxygen concentration distributions L2 and L3 depart from this target range Ar.

In the embodiments described below, the system is arranged so that the control range of the oxygen concentration of the single crystal silicon 6 is broadened, and the oxygen concentration distribution in the axial direction of the single crystal silicon 6 is caused to fit within the target range Ar.

Embodiment 1

Control Combined with Control of Natural Convection Generated in the Melt 5

In this embodiment, the combined used of the abovementioned 1) control of the amount of dissolved oxygen and 2) control of the amount of evaporated oxygen is assumed.

In this embodiment, the control range of the oxygen concentration of the single crystal silicon 6 can be broadened so that the oxygen concentration distribution in the axial direction of the single crystal silicon 6 is caused to fit within the target range Ar, and minute fluctuations in the oxygen concentration that are generated along the axial direction of the single crystal silicon 6 can be suppressed, by further combining control of natural convection generated in the melt 5 (hereafter referred to as "convection control") with the abovementioned control.

Here, the mechanism whereby convection is generated will be described with reference to FIG. 4.

Specifically, FIG. 4(a) shows the temperature distribution in various portions of the melt 5 in a case where heating is accomplished by disposing an undivided heater 9' around the circumference of the quartz crucible 3. As is shown in FIG. 4(a), a high temperature is measured over a broad range B1 extending from the melt surface 5a to the vicinity of the bottom surface of the crucible 3, and the temperature shows a maximum value at the circumferential edges 3a and 3b of the bottom surface of the crucible. Accordingly, as is shown in FIG. 4(a), the temperature of the bottom surface part 31 of the quartz crucible 3 is higher than the temperature of the upper parts 32 of the side walls of the quartz crucible 3, so that natural convection 20 is generated as rising currents that flow toward the upper parts of the side walls of the crucible 3 from the bottom surface of the crucible 3.

Accordingly, in the present embodiment, the following 3) convection control is performed in order to control the generation of the natural convection 20.

3) Convection Control

Convection control consists of convection suppressing control and convection promoting control.

3-1) Convection Suppressing Control

Among the various portions of the melt 5 inside the quartz crucible 3, the temperatures of these respective portions of the melt 5 are adjusted so that the generation of natural convection 20 in the melt 5 is suppressed. In concrete terms, the ratio of the amount of heating (output) of the upper heater 9a to the amount of heating (output) of the lower heater 9b is adjusted so that the temperature of the bottom surface part 31 of the quartz crucible 3 is lower than the temperature of the upper portions 32 of the side walls of the quartz crucible 3. Specifically, as is shown in FIG. 4(b), the region B2 where the temperature is high is restricted to a narrow range B2 in the vicinity of the surface 5a of the melt, and a maximum temperature is reached at the upper portions 3c and 3d of the side walls of the crucible. Accordingly, as is shown in FIG. 4(b), the temperature of the bottom surface part 31 of the quartz crucible 3 is lower than the temperature of the upper portions 32 of the side walls of the quartz crucible 3, so that the generation of natural convection 20 as rising currents that flow toward the upper portions of the side walls of the crucible 3 from the bottom surface of the crucible 3 is suppressed.

Furthermore, when this control to suppress convection is performed, it is desirable that the surface 5a of the melt coincide with roughly the center position of the upper heater 9a. Accordingly, the position of the quartz crucible 3 in the vertical direction is adjusted by driving the rotating shaft 5 in accordance with the decrease in the melt 5, so that the surface 5a of the melt 5 is caused to coincide with roughly the center position of the upper heater 9a.

In the present embodiment, the following merits are obtained.

Specifically, L1 in FIG. 6 indicates the oxygen concentration distribution of single crystal silicon 6 grown by the magnetic field applied crystal growth method. In the magnetic field applied crystal growth method, convection is suppressed so that the oxygen concentration distribution L1 is a distribution in which the oxygen concentration as a whole is lower than in the oxygen concentration distribution L2 or L3 of the single crystal silicon 6 grown by the general CZ method as described in the reference example. Accordingly, if the degree of suppression of convection is controlled by adjusting the amounts of heating of the upper and lower heaters 9a and 9b, the control range of the oxygen concentration of the single crystal silicon 6 is broadened downward. Accordingly, by controlling the oxygen concentration within the broadened control range, it is possible to correct the oxygen concentration distributions L2 and L3 so that these oxygen concentration distributions are kept within the target range Ar.

3-2) Convection Promoting Control

Figure 7A:
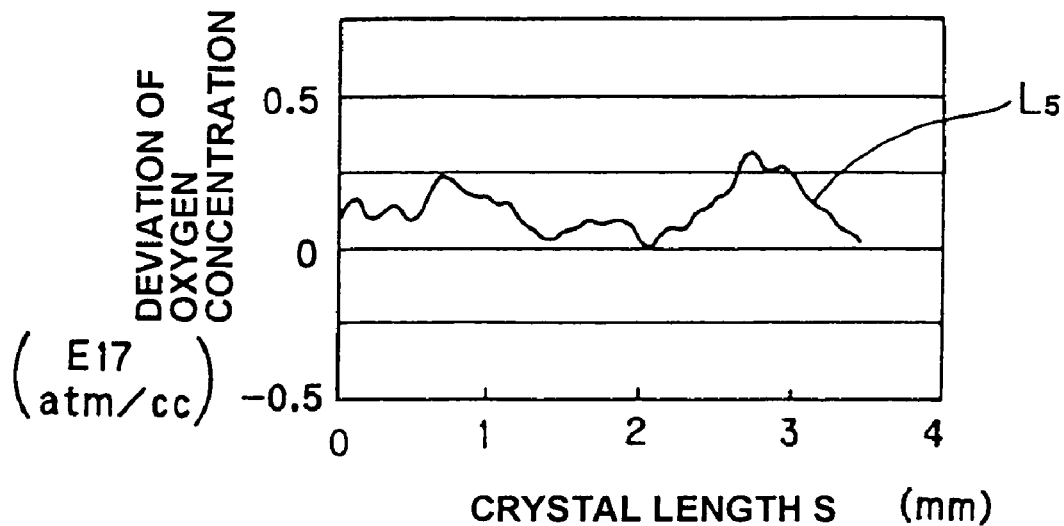
FIGS. 7(a) and 7(b) are graphs which show a comparison of fluctuations in the oxygen concentration in the direction of the axis of length of the single crystal silicon.
Figure 7B:
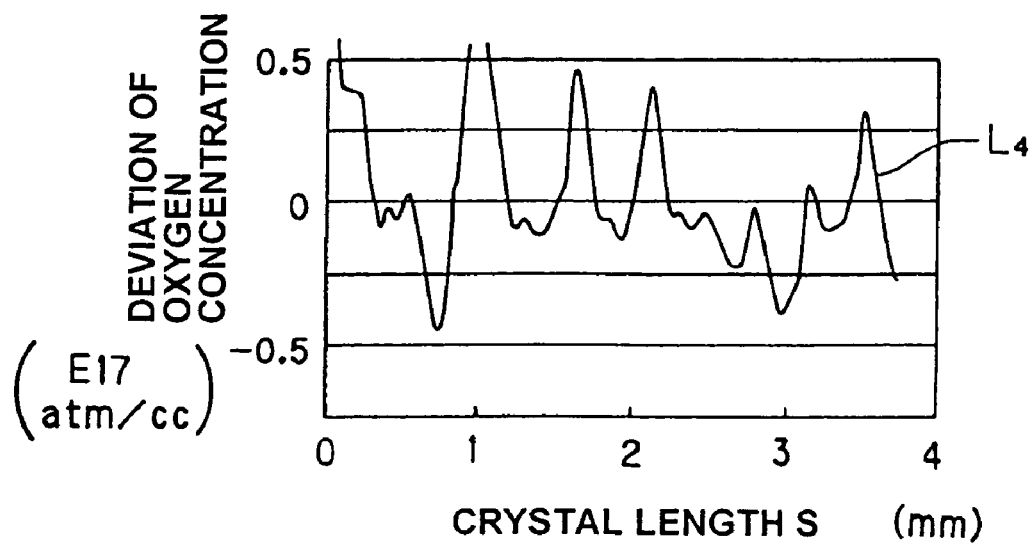

FIG. 7(b) shows the results of a simulation performed using the apparatus construction shown in FIG. 4(a). Fluctuations L4 in the oxygen concentration in the axial direction of the single crystal silicon 6 in a case where the quartz crucible 3 was heated by an undivided heater 9' are shown in this figure. The horizontal axis of FIG. 7(b) indicates the crystal length S constituting the position of the single crystal silicon 6 in the axial direction. The vertical axis of FIG. 7(b) indicates the deviation of the oxygen concentration in the boundary area 6a between the single crystal silicon 6 and melt 5 during pulling.

FIG. 7(a) shows the results of a simulation performed using the apparatus construction shown in FIG. 4(b) in a case where the abovementioned convection suppressing control of 3-1) was performed. This figure shows the fluctuations L5 in the oxygen concentration in the axial direction of the single crystal silicon 6 in a case where the quartz crucible 3 was heated by split heaters 9a and 9b. The crystal length S on the horizontal axis of FIG. 7(a) and the oxygen concentration deviation on the vertical axis respectively correspond to the horizontal axis and vertical axis of FIG. 7(b).

As is shown by L4 and L5, the oxygen concentration fluctuates with a short period relative to the total pulling time of the single crystal silicon 6. In other words, fluctuations in the oxygen concentration are generated in the boundary area 6a of the single crystal silicon 6, and these are incorporated into the single crystal silicon 6 so that these fluctuations appear as minute fluctuations in the oxygen concentration in the axial direction. Such minute fluctuations in the oxygen concentration in the axial direction cause a deterioration in the quality of the single crystal silicon 6.

Figure 9:
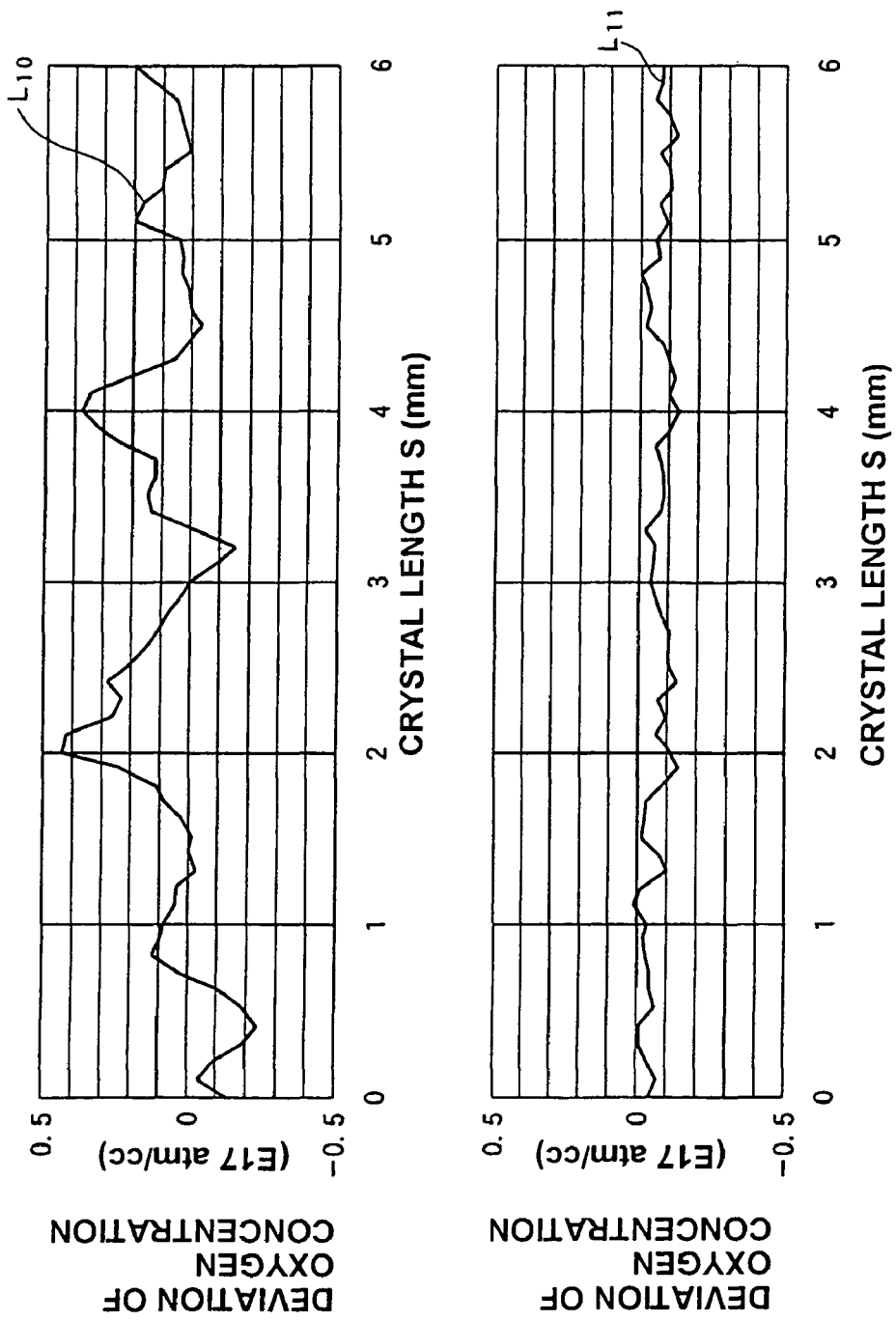
FIG. 9 is a graph which shows the results of experiments performed using the apparatus construction shown in FIG. 1.

FIGS. 9(a) and 9(b) show the results obtained when experiments were actually performed using the apparatus construction shown in FIG. 1. The crystal length S on the horizontal axes of FIGS. 9(a) and 9(b), and the oxygen concentration deviation on the vertical axes, respectively correspond to the horizontal axes and vertical axes of FIGS. 7(a) and 7(b).

FIG. 9(a) shows the fluctuations L10 in the oxygen concentration in the axial direction of the single crystal silicon 6 in a case where natural convection was suppressed by setting the ratio of the heating amounts (outputs) of the upper heater 9a and lower heater 9b at 1:0.5. In concrete terms, the generation of natural convection was suppressed by setting the ratio of the electric power applied to the upper heater 9a and lower heater 9b at 1:0.5.

FIG. 9(b) shows the fluctuations L11 in the oxygen concentration in the axial direction of the single crystal silicon 6 in a case where natural convection was promoted by setting the ratio of the heating amounts (outputs) of the upper heater 9a and lower heater 9b at 1:2. In concrete terms, the generation of natural convection was promoted by setting the ratio of the electric power applied to the upper heater 9a and lower heater 9b at 1:2.

It is seen from these FIGS. 9(a) and 9(b) that the fluctuations L11 in the oxygen concentration that occur in a case where the generation of natural convection is promoted are small compared to the fluctuations L10 in the oxygen concentration that occur in a cases where natural convection is suppressed.

Accordingly, judging from this experimental results, if fluctuations in the oxygen concentration in the boundary area 6a are suppressed as indicated by L11 in FIG. 9(b), fluctuations in the axial direction of the single crystal silicon 6 will be suppressed. As a result, a stable oxygen concentration distribution can be obtained along the axial direction of the single crystal silicon 6, so that the quality of the single crystal silicon 6 is improved.

Furthermore, in the present embodiment, convection can be controlled by using simple heaters 9a and 9b without introducing the magnetic field applied crystal growth method that leads to increased cost and size; accordingly, the cost of the apparatus can be reduced, and the apparatus can be made more compact.

Furthermore, in this embodiment, control of the generation of convection is accomplished by disposed two stages of heaters, i. e., upper and lower heaters $9a$ and $9b$, on the sides of the crucible 3. However, in addition to this, it would also be possible to dispose a heater 12 beneath the quartz crucible 3, and to heat the bottom surface of the crucible 3 in a supplementary manner by means of this heater, so that solidification of the melt 5 in the bottom part of the crucible 3 is prevented.

Furthermore, in the present embodiment, the crucible 3 is heated from the outside by means of the heaters $9a$ and $9b$, however, the heating means used are not limited to heaters. Any type of heating means may be used as long as these means are capable of controlling natural convection 20 by adjusting the temperatures of various portions of the melt 5. For example, an electromagnetic heating method or heating by means of laser irradiation may also be employed.

Embodiment 2

Control Combined with Oxygen Concentration Control and Diameter Control by Means of Heaters In the present embodiment, the oxygen concentration distribution in the axial direction of the single crystal silicon 6 is controlled to a desired oxygen concentration distribution (hereafter referred to as "oxygen concentration control by heaters"), and the diameter of the single crystal silicon 6 is controlled to a desired diameter (hereafter referred to as "diameter control by heaters"), by adjusting the outputs of the heaters $9a$ and $9b$ shown in FIG. 1.

Specifically, the oxygen that is eluted from the quartz crucible 3 is more greatly affected by the temperature of the lower part of the crucible 3. The reason for this is that in this lower part of the crucible 3, the crucible 3 has a large area of contact with the melt 5.

On the other hand, the diameter D of the single crystal silicon 6, the solidification speed V in the boundary area $6a$ of the single crystal silicon 6 and the amount of pulling S (crystal length) of the single crystal silicon 6 have the relationship shown in equation (1) below.

$$\text{Diameter }(D) \times \text{solidification speed }(V) = \text{amount of pulling }(S) \quad (1)$$

Accordingly, if the amount of pulling S is fixed, the diameter D of the single crystal silicon 6 is determined by the solidification speed V in the boundary area $6a$.

If the temperature of the upper part of the crucible 3 and the temperature of the lower part of the crucible 3 are compared, the solidification speed V in the boundary area $6a$ is more greatly affected by the temperature environment (e. g., temperature gradient in the crystal and temperature gradient in the direction of diameter of the surface of the melt) in the upper part of the crucible 3.

In the present embodiment, in light of the abovementioned points, the following 4) oxygen concentration control by means of heaters and 5) diameter control by means of heaters are performed in combination.

4) Oxygen Concentration Control by Means of Heaters

A function in which the crystal length S of the single crystal silicon 6, i. e., the remaining molten amount of the melt 5, is taken as a variable, and the output (amount of heating) of the lower heater $9b$ is taken as a function value, is prepared beforehand. This function is set so that the oxygen concentration distribution in the axial direction of the single crystal silicon 6 is maintained at a target concentration distribution. Accordingly, the remaining molten amount of the melt 5 is measured, and the output of the lower heater $9b$ that corresponds to this measured remaining molten amount is determined from the abovementioned function. Then, a control command is sent to the lower heater $9b$ so that this output of the lower heater $9b$ is obtained. Thus, the oxygen concentration distribution in the axial direction of the single crystal silicon 6 is controlled to a desired concentration distribution by adjusting the lower heater $9b$ in accordance with the remaining molten amount of the melt 5, i. e., the crystal length S of the single crystal silicon 6.

5) Diameter Control by Means of Heaters

The following two methods may be cited as examples of diameter control. Specifically, the following methods are conceivable:

A method in which the heater output required in order to maintain the diameter of the crystal at a constant value during pulling is predicted beforehand, and the upper heater output is controlled using this predicted value as a command value.

A method in which the diameter of the crystal is constantly measured during pulling, and the output of the upper heater or the pulling speed, or both, are adjusted in accordance with the deviation between the crystal diameter and the target diameter, so that the diameter is controlled to a fixed value.

In concrete terms, the control method of the abovementioned 5-1) is as follows:

Specifically, a function in which the crystal length S of the single crystal silicon 6, i. e., the remaining molten amount of the melt 5, is taken as a variable, and the output (amount of heating) of the upper heater $9a$ is taken as a function value, is prepared beforehand. This function is set so that the diameters of respective parts of the single crystal silicon 6 in the axial direction are maintained at a target diameter. Accordingly, the remaining molten amount of the melt 5 is measured, and the output of the upper heater $9a$ corresponding to this measured remaining molten amount is determined from the abovementioned function. Then, a control command is sent to the upper heater $9a$ so that this output of the upper heater $9a$ is obtained. Thus, the diameters of respective parts of the single crystal silicon 6 in the axial direction are controlled to a desired diameter by adjusting the upper heater $9a$ in accordance with the remaining molten amount of the melt 5, i. e., the crystal length S of the single crystal silicon 6.

In concrete terms, the control method of the abovementioned 5-2) is as follows:

Specifically, a measuring device which measures the diameter of the single crystal silicon 6 during pulling is provided. A device which optically measures the diameter, a device which measures the total weight of the pulled single crystal silicon 6 as a parameter for the diameter or the like is conceivable as this measuring device. The diameter of the single crystal silicon 6 measured by the measuring device and the target diameter are compared, and the output of the upper heater $9a$ or the pulling speed, or both, are adjusted so that the abovementioned deviation is eliminated, thus causing the diameter to coincide with the desired diameter. Furthermore, a general control procedure such as PID control or the like can be incorporated in order to realize this diameter control.

Thus, in the present embodiment, the diameter of the single crystal silicon 6 can be simultaneously controlled while controlling the oxygen concentration distribution in the axial direction of the single crystal silicon 6 using the heaters $9a$ and $9b$.

Furthermore, the abovementioned 1) control of the amount of dissolved oxygen and 2) control of the amount of evaporated oxygen can also be performed in combination with this control.

Embodiment 3

Control Combined with Oxygen Concentration Control by Means of Heaters and Convection Control In the present embodiment, the abovementioned 3) convection control and 4) control of the oxygen concentration by means of heaters are performed in combination. Furthermore, the abovementioned 1) control of the amount of dissolved oxygen and 2) control of the amount of evaporated oxygen can also be performed in combination with this control.

In the present embodiment, minute fluctuations in the oxygen concentration that are generated in the axial direction of the single crystal silicon 6 can be suppressed while controlling the oxygen concentration distribution in the axial direction of the single crystal silicon 6 by using heaters 9a and 9b that are simple, low-cost and compact compared to the magnetic field applied crystal growth method.

Embodiment 4

Control Combined with Oxygen Concentration Control and Diameter Control by Means of Heaters, and Convection Control In the present embodiment, the abovementioned 3) convection control, 4) oxygen concentration control by means of heaters and 5) diameter control by means of heaters are performed in combination. Furthermore, the abovementioned 1) control of the amount of dissolved oxygen and 2) control of the amount of evaporated oxygen can also be performed in combination with this control.

In the present embodiment, the diameter of the single crystal silicon can be controlled, and minute fluctuations in the oxygen concentration that are generated in the axial direction of the single crystal silicon 6 can be suppressed, while similarly controlling the oxygen concentration distribution in the axial direction of the single crystal silicon 6 using the output of this upper heater 9a.

Embodiment 5

Oxygen Concentration Control by Means of Heaters and Process Conditions

Figure 8:
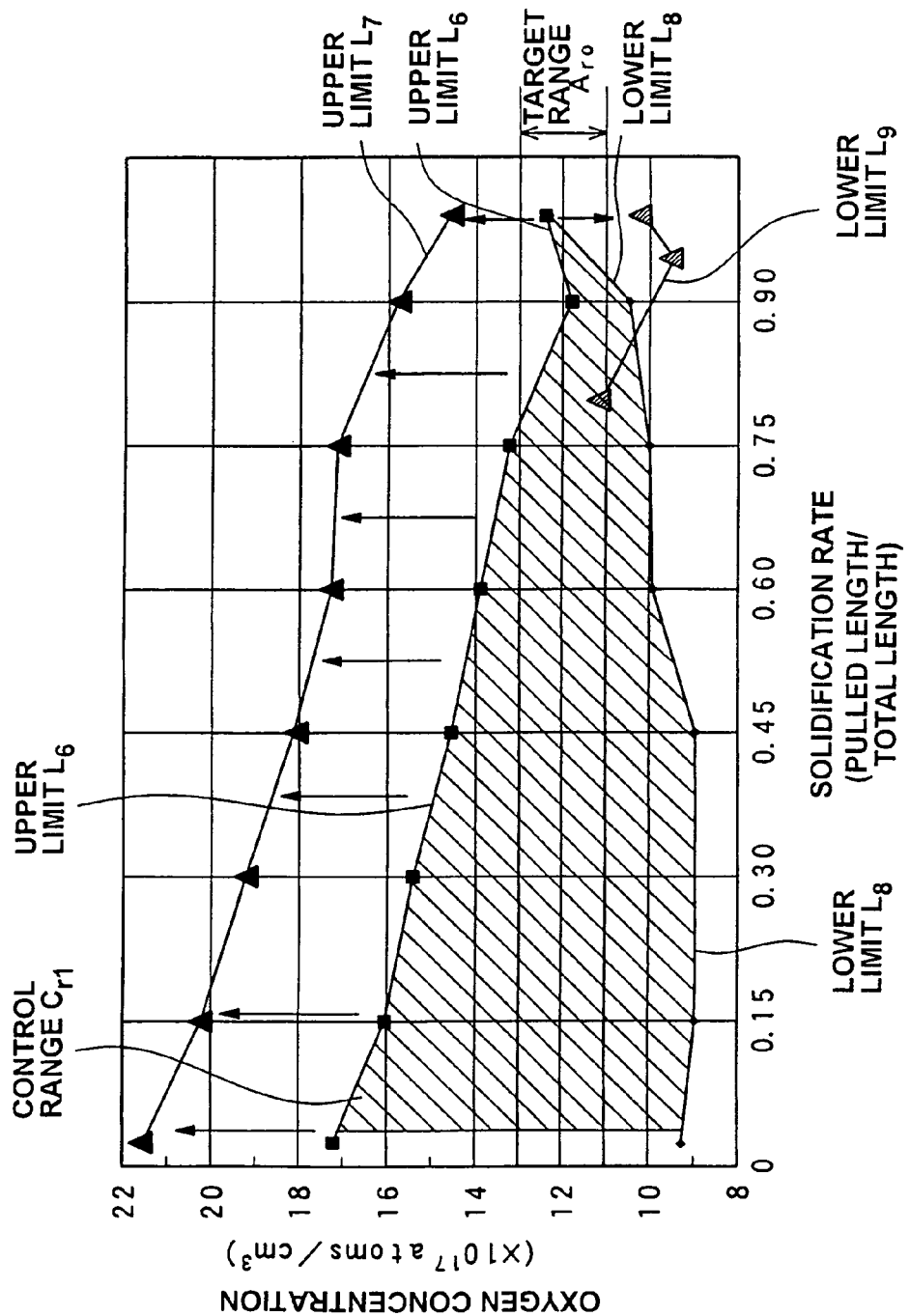
FIG. 8 is a graph which shows the target range of the oxygen concentration distribution in the direction of the axis of length of the single crystal silicon.

FIG. 8 is a figure which corresponds to FIG. 6, and which shows the solidification rate on the horizontal axis and the oxygen concentration on the vertical axis. Here, the solidification rate is a value that is given by x/W, where W is the weight of the polycrystalline raw material that is melted inside the quartz crucible, and x is the weight of the single crystal during pulling. This value has a more or less proportional relationship to the crystal length S on the horizontal axis in FIG. 6.

In FIG. 8, the target range Ar0 shows one example of a target range for the oxygen concentration in single crystal silicon 6 required in recent years; this corresponds to the target range Ar in FIG. 6.

Cr1 indicated by shading in FIG. 8 is the control of the oxygen concentration that can be caused to vary merely by adjusting the output ratio (electric power ratio) of the heaters 9a and 9b. Within this control range Cr1, the oxygen concentration in the axial direction of the single crystal silicon 6 can be controlled to a desired concentration. It is seen that the control range Cr1 depends on the crystal length S of the single crystal silicon 6. The upper limit of the control range Cr1 is indicated by L6, and this upper limit L6 drops as the solidification rate increases. Furthermore, the lower limit of the control range is indicated by L8, and this lower limit L8 rises as the solidification rate increases. In other words, the control range of the oxygen concentration becomes narrower in the latter stage of the pulling of the single crystal silicon 6. In the latter stage of pulling, control of the oxygen concentration merely by adjusting the heaters 9a and 9b is possible only in an extremely narrow range within the target range Ar0.

When the ratio of the heating amounts (outputs) of the upper heater 9a and lower heater 9b was set at 1:3.5, the oxygen concentration distribution L6 indicated by the upper limit of the control range Cr1 was obtained. In concrete terms, the oxygen concentration distribution L6 was obtained by setting the ratio of the electric power applied to the upper heater 9a and lower heater 9b at 1:3.5.

Furthermore, when the ratio of the heating amounts (outputs) of the upper heater 9a and lower heater 9b was set at 1:0.7, the oxygen concentration distribution L8 indicated by the lower limit of the control range Cr1 was obtained. In concrete terms, the oxygen concentration distribution L8 was obtained by setting the ratio of the electric power applied to the upper heater 9a and lower heater 9b at 1:0.7.

Thus, the oxygen concentration distribution can be caused to shift to the high oxygen side within the control range Cr1 by adjusting the output ratio to an output ratio which is such that the output of the lower heater 9b is relatively large, and the oxygen concentration distribution can be caused to shift to the low oxygen side within the control range Cr1 by adjusting the output ratio to an output ratio which is such that the output of the lower heater 9b is relatively small.

In the present Embodiment 5, control is performed in which the output ratio is adjusted to an output ratio which is such that the output of the lower heater 9b is relatively large, and in which the rpm of the quartz crucible 3 is increased. As a result, the upper limit of the control range changes from L6 to L7, so that at least the oxygen concentration in the latter stage of the pulling of the single crystal silicon 7 is caused to shift to the high oxygen side. In concrete terms, the rpm ω of the quartz crucible 3 was increased from 4 rpm to 12 rpm at an output ratio in which the ratio of the electric power applied to the upper heater 9a and lower heater 9b is set at 1:3.5, so that the output of the lower heater 9b was relatively large, thus causing the upper limit of the control range to shift to the high oxygen side, i. e., from L6 to L7.

Furthermore, control is performed in which the output ratio is adjusted to an output ratio in which the output of the lower heater 9b is relatively small, and in which the pressure inside the CZ furnace 2 is increased. As a result, the lower limit of the control range changes from L8 to L9, so that at least the oxygen concentration in the latter stage of the pulling of the single crystal silicon 6 is caused to shift to the low oxygen side. In concrete terms, the pressure inside the CZ furnace 2 in the latter stage of pulling was increased to a value that was 1.5 times the value during the former stage of pulling at an output ratio in which the ratio of the electric power applied to the upper heater 9a and lower heater 9b was set at 1:0.7 so that the output of the lower heater 9b was relatively small, thus causing the lower limit of the control range to shift to the low oxygen side, i. e., form L8 to L9.

As a result, the control range of the oxygen concentration in the latter stage of the pulling of the single crystal silicon 6 was broadened, so that this control range had a width comparable to that of the control range in the former stage of pulling. Consequently, the oxygen concentration can be controlled within the target range Ar0 in the latter stage of pulling in the same manner as in the former stage of pulling, so that the oxygen concentration can always be controlled to a desired concentration within a broad control range without any dependence on the crystal length S. For example, the oxygen concentration distribution in the axial direction of the single crystal silicon 6 can be controlled to a fixed value that is the upper limit value of the target range Ar0, or can be controlled to a fixed value that is the lower limit value of the target range Ar0. Furthermore, the oxygen concentration distribution can also be controlled to an arbitrary fixed value within the target range Ar0. Furthermore, the oxygen concentration profile can be set at an arbitrary profile within the target range Ar0.

In the present embodiment, the upper limit of the control range is caused to shift to the high oxygen side by increasing the rpm of the quartz crucible 3. However, besides increasing the rpm of the quartz crucible 3, it would also similarly be possible to cause the upper limit of the control range to shift to the high oxygen side by increasing the amount of oxygen that is dissolved in the quartz crucible 3. For example, the upper limit of the control range can be caused to shift to the high oxygen side by increasing the heating temperature of the quartz crucible 3. Furthermore, the upper limit of the control range may also be caused to shift to the high oxygen side by varying other process conditions.

Furthermore, in the present embodiment, the lower limit of the control range is caused to shift to the low oxygen side by increasing the pressure inside the CZ furnace 2. However, besides increasing the pressure inside the CZ furnace 2, it would also similarly be possible to cause the lower limit of the control range to shift to the low oxygen side by decreasing the amount of oxygen that evaporates from the surface 5a of the melt. For example, the lower limit of the control range can be caused to shift to the low oxygen side by varying the flow rate of the argon gas 7, and the distance D0 between the thermal insulating plate 8 and the surface 5a of the melt. Furthermore, the lower limit of the control range may also be caused to shift to the low oxygen side by varying other process conditions.

Embodiment 6

Convection Suppressing Control

An embodiment in which the abovementioned 3-1) convection suppressing control is performed independently is also possible.

Specifically, as is shown in FIG. 9(b), minute fluctuations in the oxygen concentration in the axial direction of the single crystal silicon 6 can be suppressed by setting the ratio of the heating amounts (outputs) of the upper heater 9a and lower heater 9b at 1:2, so that the output ratio is adjusted to an output ratio which is such that the output of the lower heater is relatively large.

Thus, minute fluctuations in the oxygen concentration that are generated along the axial direction of the crystal 6 can be suppressed using heaters 9 which are compact and low-cost compared to the introduction of the magnetic field applied crystal growth method.

In the single crystal ingots manufactured by the respective embodiments described above, the oxygen concentration profile can be precisely maintained at a desired profile without any deviation, within the target range Ar or Ar0. Accordingly, subsequent inspection processes are simplified, and the product circulation system is simplified.

INDUSTRIAL APPLICABILITY

The present invention can be applied not only in cases where single crystal silicon is pulled, but also in cases where semiconductors other than single crystal silicon are pulled.

The invention claimed is:

1. A single crystal semiconductor manufacturing method in which a quartz crucible is accommodated inside a single crystal pulling vessel, a polycrystalline raw material is melted inside the quartz crucible, a single crystal semiconductor is pulled up from the melt inside the quartz crucible, and an oxygen concentration in the single crystal semiconductor is controlled during the pulling, comprising the steps of:

adjusting the diameter of the single crystal semiconductor to a desired diameter by controlling an output from an upper-side heating means based on a length of the single crystal semiconductor being pulled up;

adjusting a ratio of an amount of heating by a lower-side heating means to an amount of heating by the upper-side heating means by controlling the output from the lower-side heating means, so that the amount of heating by the lower side heating means is larger than the amount of heating by the upper-side heating means and thereby promoting natural convection in the melt while suppressing fluctuation in the oxygen concentration in an axial direction of the single crystal semiconductor; and increasing a rotation speed of the quartz crucible or raising a heating temperature for the quartz crucible in a later stage of the pulling of the single crystal semiconductor, and shifting the oxygen concentration in the later stage of the pulling of the single crystal semiconductor to a high oxygen side, so that a control range of the oxygen concentration in the later stage of the pulling of the single crystal semiconductor has an equal range to a control range of the oxygen concentration in an earlier stage of the pulling, to thereby control the distribution of the oxygen concentration in the axial direction of the single crystal semiconductor as desired.

2. A single crystal semiconductor manufacturing method in which a quartz crucible is accommodated inside a single crystal pulling vessel, a polycrystalline raw material is melted inside the quartz crucible, a single crystal semiconductor is pulled up from the melt inside the quartz crucible, a single crystal semiconductor is pulled up from the melt inside the quartz crucible, and an oxygen concentration in the single crystal semiconductor is controlled during the pulling, comprising the steps of:

adjusting a diameter of the single crystal semiconductor by controlling an output from an upper-side heating means based on a length of the single crystal semiconductor being pulled up;

adjusting a ratio of an amount of heating by a lower-side heating means to an amount of heating by the upper-side heating means so that the amount of heating by the lower side heating means is smaller than the amount of heating by the upper side heating means, by controlling an output from the lower-side heating means; and in the later stage of the pulling of the single crystal semiconductor, increasing pressure inside the single crystal pulling vessel, controlling a flow rate of argon gas introduced into the single crystal pulling vessel, controlling a distance between a heat shielding plate and a surface of the melt so that the oxygen concentration in the later stage of the pulling of the single crystal semiconductor shifts to a low oxygen side, and control range of the oxygen concentration in the later stage of the pulling of the single crystal semiconductor has a range equal to a control range of the oxygen concentration in an earlier stage of the pulling, thereby controlling a distribution of the oxygen concentration in the axial direction of the single crystal semiconductor.

* * * * *